US008227854B2

(12) United States Patent
Ono et al.

(10) Patent No.: US 8,227,854 B2
(45) Date of Patent: Jul. 24, 2012

(54) SEMICONDUCTOR DEVICE HAVING FIRST AND SECOND RESURF LAYERS

(75) Inventors: Syotaro Ono, Kanagawa-ken (JP); Wataru Saito, Kanagawa-ken (JP); Masakatsu Takashita, Kanagawa-ken (JP); Yasuto Sumi, Kanagawa-ken (JP); Masaru Izumisawa, Kanagawa-ken (JP); Hiroshi Ohta, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 460 days.

(21) Appl. No.: 11/936,412

(22) Filed: Nov. 7, 2007

(65) Prior Publication Data

US 2008/0135926 A1     Jun. 12, 2008

(30) Foreign Application Priority Data

Nov. 20, 2006  (JP) ................... 2006-313557

(51) Int. Cl.
*H01L 29/66* (2006.01)
(52) U.S. Cl. ........ 257/328; 257/329; 257/339; 257/342; 257/401; 257/409; 257/E29.118; 438/283
(58) Field of Classification Search .......... 257/328, 257/401, E29.118, 329, 339, 342, 409; 438/283
See application file for complete search history.

(56) References Cited

U.S. PATENT DOCUMENTS

| 5,346,835 | A  | * | 9/1994  | Malhi et al. ............... 438/200 |
| 6,069,396 | A  | * | 5/2000  | Funaki ..................... 257/492 |
| 6,667,515 | B2 | * | 12/2003 | Inoue ...................... 257/341 |
| 6,693,338 | B2 | * | 2/2004  | Saitoh et al. ............... 257/492 |
| 6,844,592 | B2 | * | 1/2005  | Yamaguchi et al. .......... 257/341 |
| 7,115,475 | B2 |   | 10/2006 | Yamaguchi et al. |
| 2005/0280086 | A1 | * | 12/2005 | Saito et al. ................. 257/341 |
| 2006/0124997 | A1 |   | 6/2006  | Yamauchi et al. |
| 2006/0231917 | A1 |   | 10/2006 | Ono et al. |
| 2007/0194375 | A1 |   | 8/2007  | Kawaguchi et al. |

FOREIGN PATENT DOCUMENTS

JP          2001-244461          9/2001

OTHER PUBLICATIONS

U.S. Appl. No. 12/620,045, filed Nov. 17, 2009, Ohta, et al.
U.S. Appl. No. 11/680,912, filed Mar. 1, 2007, Wataru Saito, et al.
Tatsuhiko Fujihira, "Theory of Semiconductor Superjunction Devices", Jpn. J. Appl. Phys. vol. 36, Part 1, No. 10, Oct. 1997, pp. 6254-6262.

* cited by examiner

*Primary Examiner* — Matthew E Warren
*Assistant Examiner* — John Lin
(74) *Attorney, Agent, or Firm* — Oblon, Spivak, McClelland, Maier & Neustadt, L.L.P.

(57) ABSTRACT

A semiconductor device includes: a drift layer having a superjunction structure; a semiconductor base layer selectively formed in a part of one surface of the drift layer; a first RESURF layer formed around a region having the semiconductor base layer formed thereon; a second semiconductor RESURF layer of a conductivity type which is opposite to a conductivity type of the first semiconductor RESURF layer; a first main electrode connected to a first surface of the drift layer; and a second main electrode connected to a second surface of the drift layer. The first RESURF layer is connected to the semiconductor base layer. The second semiconductor RESURF layer is in contact with the first semiconductor RESURF layer.

20 Claims, 6 Drawing Sheets

SEMICONDUCTOR DEVICE HAVING FIRST AND SECOND RESURF LAYERS

CROSS-REFERENCE TO RELATED APPLICATIONS

This application is based upon and claims the benefit of priority from the prior Japanese Patent Application No. 2006-313557, filed on Nov. 20, 2006; the entire contents of which are incorporated herein by reference.

BACKGROUND OF THE INVENTION

1. Field of the Invention

This invention relates to a semiconductor device, and more particularly to a power semiconductor device having a superjunction structure.

2. Background Art

Power semiconductor devices such as power MOSFET (metal oxide semiconductor field effect transistor) and IGBT (insulated gate bipolar transistor) are widely used for electric power conversion and power control in home electric apparatuses, communication apparatuses, and car-mounted motors. These power semiconductor devices have fast switching characteristics and a reverse device voltage (breakdown voltage) of several ten to several hundred volts. Semiconductor devices having optimal breakdown voltage are selected in accordance with applications.

Recently, it has been desired to downsize electric apparatuses and to increase their efficiency. With regard to the power semiconductor device incorporated in such electric apparatuses, there has been a strong demand for reducing the resistance during the ON state of the semiconductor device (ON resistance) while retaining high breakdown voltage. Typically, in a power semiconductor device, a p-type base region is connected to a source electrode, and an n-type drift region is connected to a drain electrode. In the OFF state of the semiconductor device, when high voltage is applied between the drain electrode and the source electrode, a depletion layer extends from the pn junction interface between the p-type base region and the n-type drift region (first pn junction interface) into the drift region and serves to sustain the voltage. At this time, the breakdown voltage is determined by the distance of the extending depletion layer, which depends on the dopant concentration in the drift region.

However, electric field strength in the semiconductor device is maximized at the first pn junction interface. As the dopant concentration in the drift region increases, the strength of electric field applied to the first pn junction interface increases. Thus the dopant concentration in the drift region has a certain limit determined by the breakdown voltage of the first pn junction interface. Hence, to obtain high breakdown voltage, the dopant concentration in the drift region needs to be decreased. However, this results in increasing the resistance of the drift region, and increasing the proportion of the resistance of the drift region accounting for the ON resistance of the overall semiconductor device. Consequently, the ON resistance of the overall semiconductor device increases.

Thus there is a tradeoff between the breakdown voltage and the ON resistance of the semiconductor device, and the increase of breakdown voltage results in the increase of ON resistance. The relationship between breakdown voltage and ON resistance is determined by the material forming the semiconductor device. It is extremely difficult to simultaneously realize high breakdown voltage and low ON resistance beyond the theoretical limit without improving the structure of the semiconductor device.

Hence a structure is proposed for decreasing the resistance of the drift region beyond the theoretical limit of the material (see, e.g., T. Fujihira, "Theory of semiconductor superjunction devices", Jpn. J. Appl. Phys., Vol. 36 (1997), pp. 6254-6262, hereinafter referred to as Non-Patent Document 1). Non-Patent Document 1 discloses a structure having a drift region where p-type semiconductor layers and n-type semiconductor layers are alternately arranged along the direction orthogonal to the direction of current flow. In such a structure, a depletion layer extends also from the pn junction interface between the p-type semiconductor layer and the n-type semiconductor layer in the drift region (second pn junction interface), besides the first pn junction interface described above. Thus the electric field is prevented from concentrating only on the first pn junction interface. Hence sufficient breakdown voltage can be sustained even if the dopant concentration in the n-type semiconductor layer is made higher than in the drift region of a normal semiconductor device. Consequently, the ON resistance of the semiconductor device, particularly the drift resistance, can be reduced.

The semiconductor device disclosed in Non-Patent Document 1 is known as a lateral semiconductor device because current flows laterally in the semiconductor device. In contrast, there is also a disclosure of a vertical semiconductor device, where the p-type semiconductor layers and n-type semiconductor layers in the drift region are vertically arranged, passing current vertically (see, e.g., JP-A 2001-244461(Kokai)). Such a structure of the drift region is known as a superjunction structure.

In a semiconductor device having a superjunction structure, it is a major problem how to ensure sufficient breakdown voltage in the edge termination section, which is the peripheral section of the semiconductor device. If the breakdown voltage of the edge termination section is low, the breakdown voltage of the overall semiconductor device decreases because it is determined by the breakdown voltage of the edge termination section. Furthermore, it also raises concerns about the decrease of reliability of the semiconductor device. Moreover, avalanche current concentrating on the edge termination section also causes the breakdown of the semiconductor device.

SUMMARY OF THE INVENTION

According to an aspect of the invention, there is provided a semiconductor device including a cell section configured to pass main electrical current and a edge termination section surrounding the cell section, the semiconductor device including: a first semiconductor layer of a first conductivity type; a first main electrode connected to the first semiconductor layer; a drift layer formed on the first semiconductor layer, the drift layer including a first semiconductor pillar layer of the first conductivity type and a second semiconductor pillar layer of a second conductivity type alternately arranged parallel to an upper surface of the first semiconductor layer; a semiconductor base layer of the second conductivity type selectively formed in a surface of the drift layer so as to be connected to the second semiconductor pillar layer; a semiconductor source layer of the first conductivity type selectively formed in a surface of the semiconductor base layer; a gate insulating film provided above the drift layer; a gate electrode insulated from the drift layer and the base layer by the gate insulating film; a second main electrode electrically connected to the semiconductor base layer and the semiconductor source layer; a first semiconductor RESURF layer of the second conductivity type formed in the surface of the drift layer in the edge termination section and connected to the semiconductor base layer; and a second semiconductor RESURF layer of the first conductivity type formed on the first semiconductor RESURF layer in contact with the first semiconductor RESURF layer.

According to another aspect of the invention, there is provided a semiconductor device including: a drift layer having a superjunction structure; a semiconductor base layer selectively formed in a part of one surface of the drift layer; a first RESURF layer formed around a region having the semiconductor base layer formed thereon, the first RESURF layer being connected to the semiconductor base layer; a second semiconductor RESURF layer of a conductivity type which is opposite to a conductivity type of the first semiconductor RESURF layer, the second semiconductor RESURF layer being in contact with the first semiconductor RESURF layer; a first main electrode connected to a first surface of the drift layer; and a second main electrode connected to a second surface of the drift layer.

DETAILED DESCRIPTION OF THE INVENTION

Figure 1:
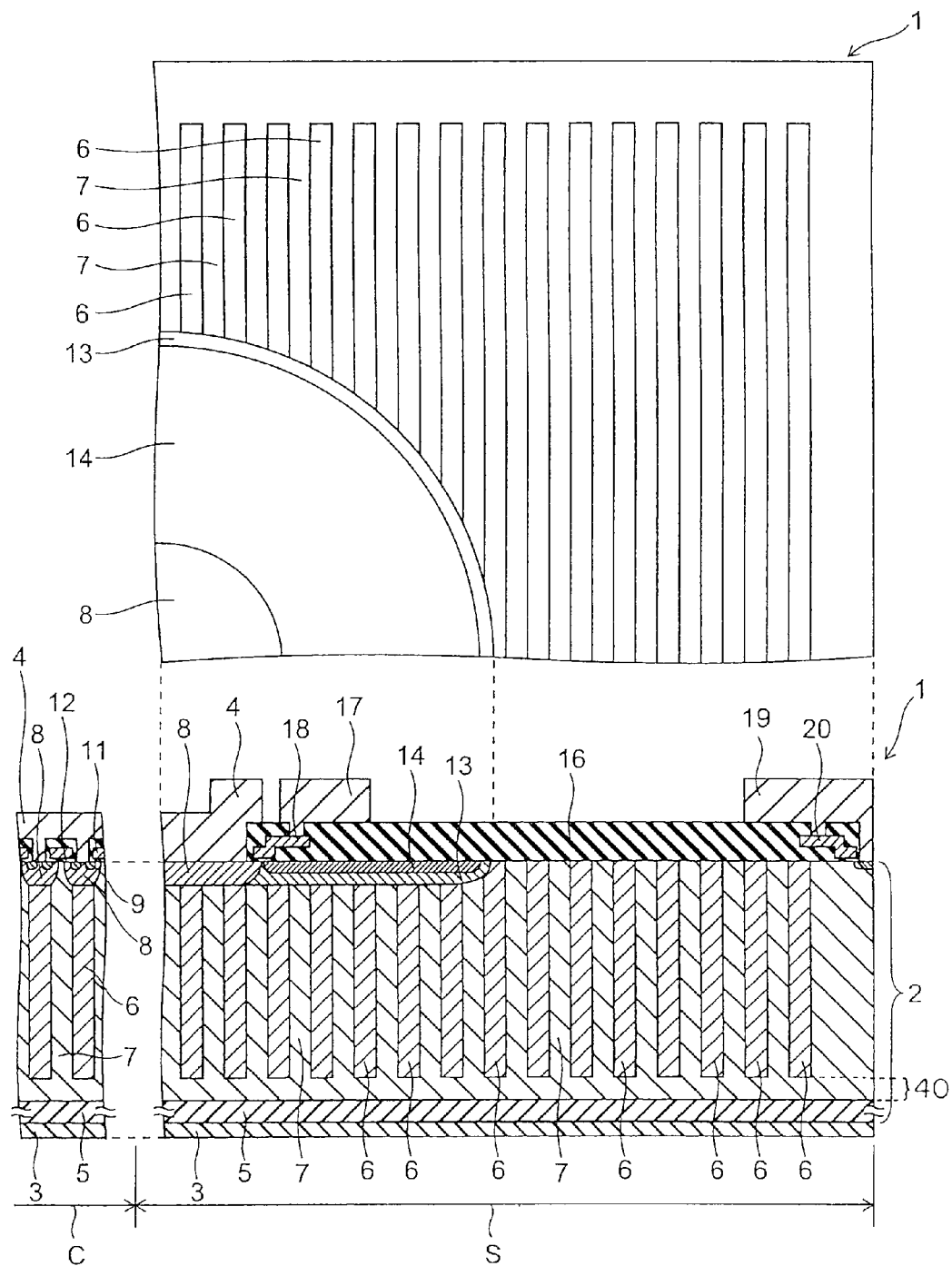
FIG. 1 is a plan view and a cross-sectional view illustrating a semiconductor device according to a embodiment of the invention.

An embodiment of the invention will now be described with reference to the drawings. In the following embodiment, it is assumed that the first conductivity type and the second conductivity type are n-type and p-type, respectively. Like elements in the drawings are marked with like reference numerals.

FIG. 1 shows a plan view and a cross-sectional view illustrating a semiconductor device according to the embodiment of the invention. In the plan view of FIG. 1, only the configuration of the semiconductor substrate is shown for ease of viewing, and the configuration on the semiconductor substrate is not shown. The same also applies to FIGS. 5 and 6 described later.

As shown in FIG. 1, the semiconductor device 1 according to this embodiment is illustratively a vertical power MOSFET. In the semiconductor device 1, a cell section C for passing current and a edge termination section S surrounding the cell section C are defined. The semiconductor device 1 includes an n-type semiconductor substrate 2 illustratively made of silicon or other semiconductor material. A drain electrode 3 is provided on the downside of the semiconductor substrate 2, and a source electrode 4 is provided on the upside of the semiconductor substrate 2. The drain electrode 3 is provided entirely on the lower surface of the semiconductor substrate 2, or on both the cell section C and the edge termination section S. On the other hand, the source electrode 4 is provided only on the cell section C and the inner peripheral region of the edge termination section S adjacent to the cell section C.

In the semiconductor substrate 2, in both the cell section C and the edge termination section S, the lower portion constitutes an n-type semiconductor layer 5. The lower surface of the n-type semiconductor layer 5 is connected to the drain electrode 3. On the n-type semiconductor layer 5 in the semiconductor substrate 2, a plurality of stripe-shaped p-type semiconductor pillar layers 6 are provided, and the portions of the semiconductor substrate 2 between the p-type semiconductor pillar layers 6 constitute stripe-shaped n-type semiconductor pillar layers 7. That is, in parallel to the upper surface of the n-type semiconductor layer 5, the p-type semiconductor pillar layers 6 and n-type semiconductor pillar layers 7 are alternately and periodically arranged. The portion where a plurality of p-type semiconductor pillar layers 6 and n-type semiconductor pillar layers 7 are alternately arranged is hereinafter referred to as a "drift layer". It is assumed that the arranging direction of the p-type semiconductor pillar layers 6 and n-type semiconductor pillar layers 7 is "X-direction" and the thickness direction of the semiconductor substrate 2 is "Y-direction".

In an adjacent pair of the p-type semiconductor pillar layer 6 and the n-type semiconductor pillar layer 7, the p-type dopant dose amount in the p-type semiconductor pillar layer 6 is equal or substantially equal to the n-type dopant dose amount in the n-type semiconductor pillar layer 7. Furthermore, the n-type semiconductor pillar layer 7 is connected to the drain electrode 3 through the n-type semiconductor layer 5. Thus the p-type semiconductor pillar layers 6 and n-type semiconductor pillar layers 7 form a superjunction structure. This superjunction structure is formed not only in the cell section C but also in the edge termination section S. For example, the p-type semiconductor pillar layer 6 and the n-type semiconductor pillar layer 7 have a dopant concentration of $2 \times 10^{15}$ cm$^{-3}$. Thus the semiconductor device 1 can realize a breakdown voltage of 600 V, for example.

In the upper surface of the semiconductor substrate 2, or the surface of the drift layer, a p-type base layer 8 is selectively formed so as to be connected to the p-type semiconductor pillar layers 6. More specifically, in the cell section C, the p-type base layer 8 is formed only in the directly overlying region of a p-type semiconductor pillar layer 6 and its peripheral portion, extends along the p-type semiconductor pillar layer 6 like a stripe, and is connected to the p-type semiconductor pillar layer 6. On the other hand, in the edge termination section S, the p-type base layer 8 is formed only in a ring-shaped, inner peripheral region adjacent to the cell section C and placed directly above both the p-type semiconductor pillar layers 6 and n-type semiconductor pillar layers 7. The p-type base layer 8 has a thickness of 3 to 4 μm, for example. Furthermore, in part of the upper surface of the p-type base layer 8 formed in the cell section C, two stripe-shaped n-type source layers 9 extending parallel to the p-type base layer 8 are formed.

Furthermore, on the semiconductor substrate 2 in the cell section C, a plurality of gate electrodes 11 are provided. The gate electrode 11 extends parallel to and directly above the n-type semiconductor pillar layer 7, and along its width, extends between the directly overlying regions of a pair of n-type source layers 9 sandwiching the n-type semiconductor pillar layer 7. The gate electrode 11 is surrounded by an insulating film. The portion of this insulating film located below the gate electrode 11 constitutes a gate insulating film 12. That is, the gate insulating film 12 is provided above the drift layer, and the gate electrode 11 is insulated from the drift layer and the p-type base layer 8 of the semiconductor substrate 2 by the gate insulating film 12.

Moreover, a portion of the source electrode 4 is placed on the gate electrode 11 and the gate insulating film 12, and another portion of the source electrode 4 passes between the gate electrodes 11, extends to the semiconductor substrate 2, and is connected to the p-type base layer 8 and the n-type source layer 9. Thus the p-type semiconductor pillar layer 6 is electrically connected to the source electrode 4 through the p-type base layer 8. On the other hand, in the edge termination section S, the gate electrode 11 is not provided, but the lower surface of the source electrode 4 is entirely connected to the p-type base layer 8.

In the edge termination section S, outside the p-type base layer 8 in the upper surface of the drift layer, a p-type RESURF layer 13 is formed. Thus the edge termination section S constitutes a RESURF (REduced SURface Field) structure. The p-type RESURF layer 13 is shaped like a ring surrounding the p-type base layer 8 as viewed from above and is connected to the p-type base layer 8. The dopant concentration in the p-type RESURF layer 13 is lower than the dopant concentration in the p-type base layer 8.

In part of the upper surface of the p-type RESURF layer 13, an n-type RESURF layer 14 is formed in contact with the p-type RESURF layer 13. As viewed from above, the n-type RESURF layer 14 is shaped like a ring concentric with the p-type RESURF layer 13, and its outer edge reaches substantially the same position as the outer edge of the p-type RESURF layer 13 in parallel. The dose amount which is a integral of a dopant concentration profile along a depth direction in the n-type RESURF layer 14 is equal or substantially equal to the dose amount which is a integral of a dopant concentration profile along a depth direction in the p-type RESURF layer 13. As viewed from above, the dose amount in the p-type RESURF layer 13 and the n-type RESURF layer 14 is preferably e.g. $1 \times 10^{11}$ to $3 \times 10^{12}$ cm$^{-2}$, and specifically $1.2 \times 10^{12}$ cm$^{-2}$. The p-type RESURF layer 13 and the n-type RESURF layer 14 are hereinafter collectively referred to as the "RESURF layer". The edge of the RESURF layer on the outer peripheral side of the semiconductor device is referred to as the "RESURF edge".

An insulating film 16 is provided in the field region outside the directly overlying region of the p-type base layer 8 on the semiconductor substrate 2. A field plate electrode 17 is provided above the inner peripheral portion of the insulating film 16 and connected to an electrode 18 buried in the insulating film 16. The field plate electrode 17 is connected to the gate electrode 11 or the source electrode 4. On the other hand, an equipotential ring 19 is provided above the outer peripheral portion of the insulating film 16 and connected to an electrode 20 buried in the insulating film 16.

Next, the operation and effect of this embodiment are described.

Figure 2:
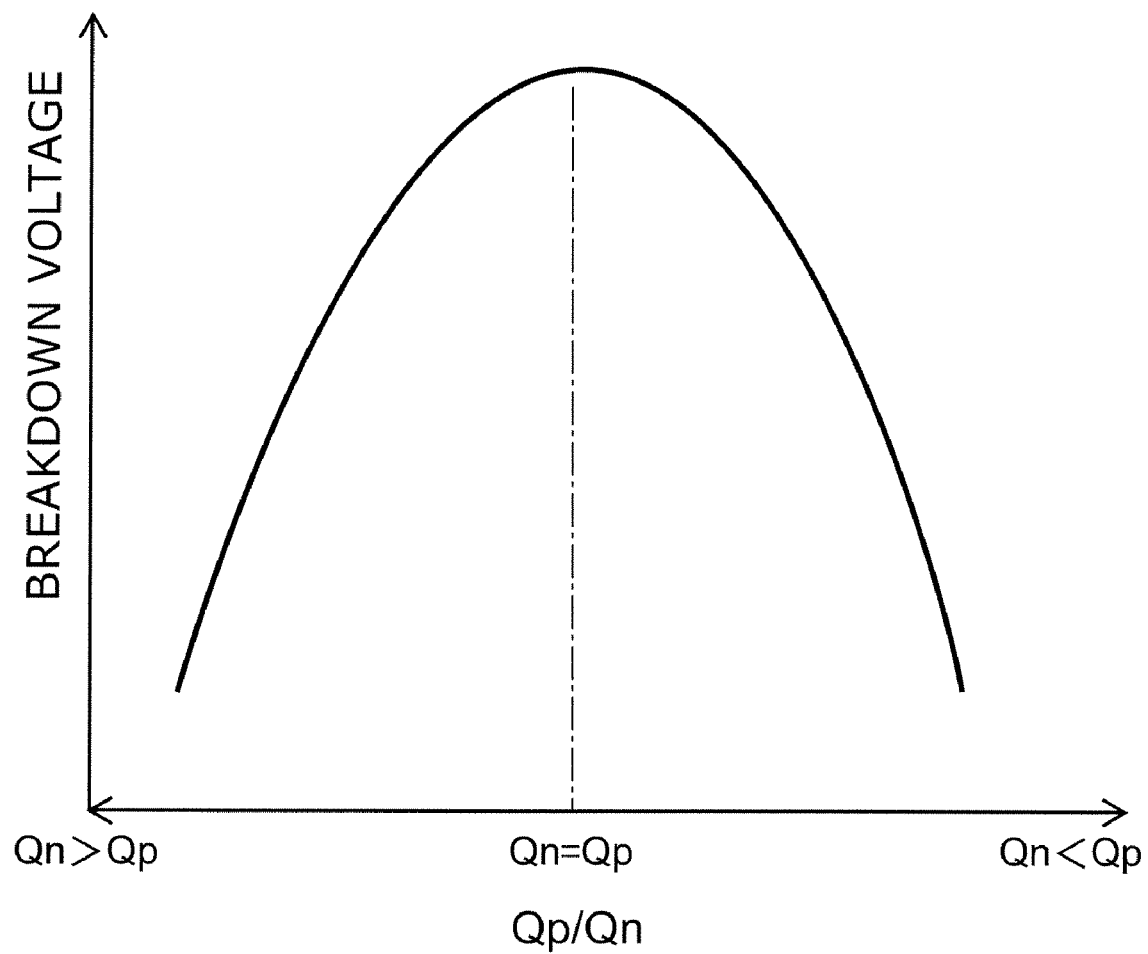
FIG. 2 is a graph illustrating the effect of dose amount ratio in a superjunction structure exerting on breakdown voltage of the semiconductor device, where the horizontal axis represents a ratio of the dose amount in a p-type semiconductor pillar layer to the dose amount in a n-type semiconductor pillar layer, and the vertical axis represents breakdown voltage.

FIG. 2 is a graph illustrating the effect of dose amount ratio in the superjunction structure exerting on the breakdown voltage of the semiconductor device, where the horizontal axis represents the ratio of the dose amount in the p-type semiconductor pillar layer to the dose amount in the n-type semiconductor pillar layer, and the vertical axis represents breakdown voltage.

The dose amount shown in FIG. 2 is the total dose amount in each of the p-type semiconductor pillar layer 6 and the n-type semiconductor pillar layer 7 as viewed in the X-direction. Assuming that the dose amount in the p-type semiconductor pillar layer 6 is denoted by Qp (cm$^{-2}$) and the dose amount in the n-type semiconductor pillar layer 7 is denoted by Qn (cm$^{-2}$), the value on the horizontal axis in FIG. 2 can be expressed as Qp/Qn.

Figure 3:
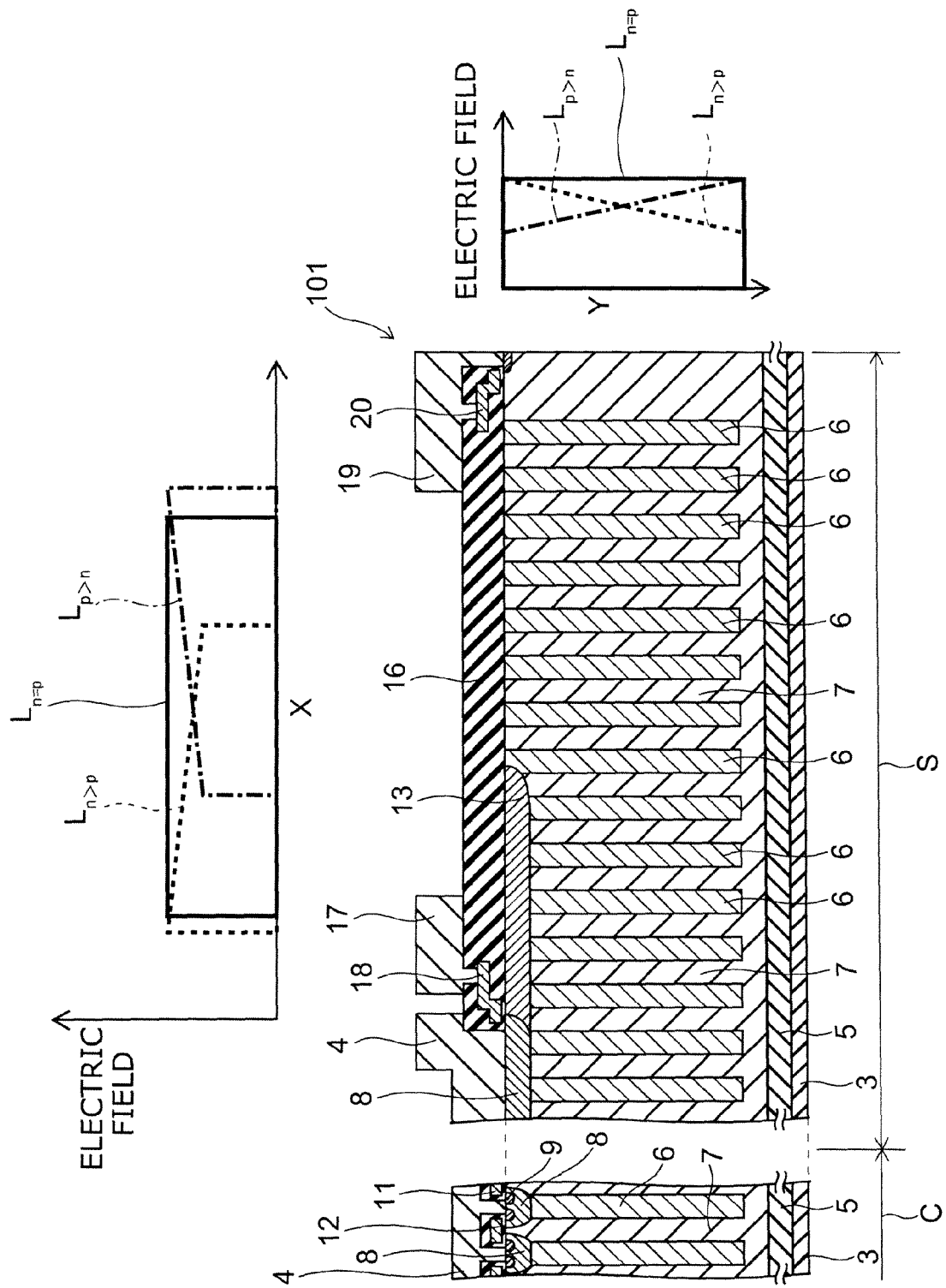
FIG. 3 is a cross-sectional view illustrating a semiconductor device according to a comparative example of this embodiment, and schematic graphs illustrating electric field strength in various portions of this semiconductor device in correlation with their positions.

FIG. 3 shows a cross-sectional view illustrating a semiconductor device according to a comparative example of this embodiment, and schematic graphs illustrating electric field strength in various portions of this semiconductor device in correlation with their positions.

First, the operation of the semiconductor device 101 according to the comparative example of this embodiment is described with reference to FIG. 3. The semiconductor device 101 includes pillar layers constituting a superjunction structure, and a RESURF structure made of a p-type RESURF layer 13. The semiconductor device 101 corresponds to the semiconductor device 1 according to this embodiment (see FIG. 1) from which the n-type RESURF layer 14 is omitted.

As shown in FIG. 3, in the semiconductor device 101, a voltage is applied between the drain electrode 3 and the source electrode 4 with the drain electrode 3 being positive and the source electrode 4 being negative. Then a depletion layer extends into the pillar layers from the pn interface between the p-type semiconductor pillar layer 6 and the n-type semiconductor pillar layer 7 and sustains the breakdown voltage of the cell section C and the edge termination section S.

At this time, by the depletion of the p-type RESURF layer 13, the depletion layer is extended substantially throughout the upper surface of the semiconductor substrate 2, providing horizontal potential sharing. This serves to alleviate electric field concentration on the edge termination section of the p-type base layer 8 and the edge termination section of the field plate electrode 17 and to ensure sufficient breakdown voltage in the edge termination section S. Hence the overall breakdown voltage of the semiconductor device 101 can be increased. Furthermore, by preventing avalanche breakdown from occurring in the edge termination section S, it is possible to prevent the semiconductor device from being destroyed when avalanche breakdown occurs.

However, as shown in FIG. 2, the breakdown voltage of this semiconductor device depends on the dopant amount ratio between the pillar layers in the drift layer. When the dose amount (Qp) in the p-type semiconductor pillar layer 6 is equal to the dose amount (Qn) in the n-type semiconductor pillar layer 7, that is, when Qp=Qn, the extent of the depletion layer in response to the voltage is maximized, and the breakdown voltage is maximized. However, when one dose amount exceeds the other dose amount due to, for example, process variations, that is, when Qp>Qn or Qn>Qp, the depletion layer does not sufficiently extend, and the breakdown voltage decreases. It is noted that the ON resistance of the semiconductor device decreases as Qn increases.

As shown in FIG. 3, the electric field distribution in the semiconductor device for Qn>Qp is different from that for Qp>Qn. In the case of Qn=Qp, the electric field distribution in the semiconductor device is uniform in both the X-direction and the Y-direction as shown by line $L_{n=p}$ in FIG. 3. Thus the electric field equally extends in the p-type semiconductor pillar layer 6 and the n-type semiconductor pillar layer 7, resulting in high breakdown voltage. Furthermore, also in the edge termination section S, the depletion layer extends horizontally, and the p-type RESURF layer 13 is depleted.

In the case of Qn>Qp, the electric field distribution is as shown by line $L_{n>p}$, where the electric field is strong in the cell section C than in the edge termination section S, and on the source electrode side (upside) than on the drain electrode side (downside). This is an electric field distribution similar to that in a conventional semiconductor device where a RESURF structure is formed in a uniform n-type drift layer.

However, in the case of Qp>Qn, the electric field distribution is as shown by line $L_{p>n}$, where the electric field is strong in the edge termination section S than in the cell section C, and on the downside than on the upside. In this case, the p-type RESURF layer 13 becomes less likely to be depleted because of the weak electric field therein. If the p-type RESURF layer 13 is not depleted, the voltage cannot be shared by the p-type RESURF layer 13, and the electric field concentrates on the RESURF edge. This may result in breakdown in this portion. Furthermore, if impact ionization at the RESURF edge is enhanced, the resulting holes may enter the p-type base layer through the long surface of the RESURF layer, varying the breakdown voltage pattern or creating some kinks in the pattern. This may decrease the reliability of the semiconductor device.

As described above, in the semiconductor device 101 having both a superjunction structure and a RESURF structure, the breakdown voltage of the edge termination section strongly depends on the balance of dopant dose amount (ratio Qp/Qn). There is no problem if Qn=Qp can be constantly achieved. However, under the current semiconductor manufacturing technologies, it is difficult to constantly achieve Qn=Qp because of process variations. Hence it is necessary to ensure a breakdown voltage greater than or equal to a certain value despite variations in the dose amount balance.

Thus, in the semiconductor device 1 according to this embodiment, an n-type RESURF layer 14 is provided on the p-type RESURF layer 13 in contact therewith. Hence a depletion layer extends from the pn interface between the p-type RESURF layer 13 and the n-type RESURF layer 14 to both the p-type RESURF layer 13 and the n-type RESURF layer 14. Thus the RESURF layer can be reliably depleted irrespective of the value of the ratio Qp/Qn. This serves to alleviate electric field concentration on the edge termination section of the p-type base layer 8 and the edge termination section of the field plate electrode 17 and to ensure sufficient breakdown voltage in the edge termination section S.

More specifically, in addition to the effects of the above comparative example, that is, the effect of obtaining a certain breakdown voltage by depleting the drift layer and the effect of increasing the breakdown voltage of the edge termination section by depleting the p-type RESURF layer 13, this embodiment can achieve the effect of reliably depleting the RESURF layer because of the existence of the n-type RESURF layer 14 despite variations in the dose amount balance (ratio Qp/Qn) in the drift layer. Thus, as compared with the above comparative example, in this embodiment, the RESURF layer can be reliably depleted. This serves to more reliably ensure sufficient breakdown voltage in the edge termination section, and to achieve high breakdown voltage and high reliability in the semiconductor device 1.

If arsenic (As), for example, is used as the n-type dopant implanted into the n-type RESURF layer 14, deep implantation is difficult because the arsenic atom is heavy. On the other hand, if phosphorus (P) is used as the n-type dopant, it can indeed be implanted deeply during the implantation phase, but phosphorus is likely to emerge on the surface of the silicon substrate by activation annealing. Hence, in this embodiment, an n-type RESURF layer 14 is provided on the p-type RESURF layer 13. This facilitates formation of the n-type RESURF layer 14.

Next, the effect of this embodiment is specifically described with reference to simulation results.

Figure 4A:
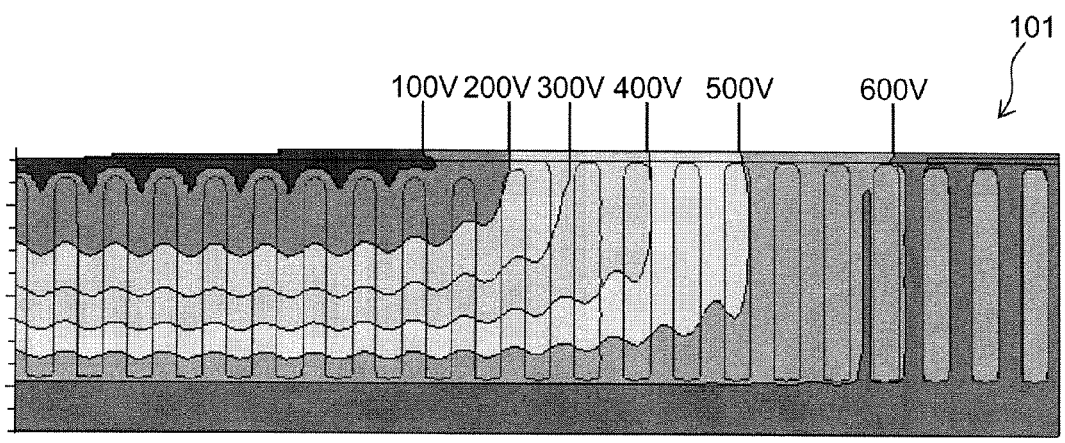
FIGS. 4A and 4B are figures showing simulation results for electric potential distribution in the semiconductor device of the comparative example and this embodiment, respectively.
Figure 4B:
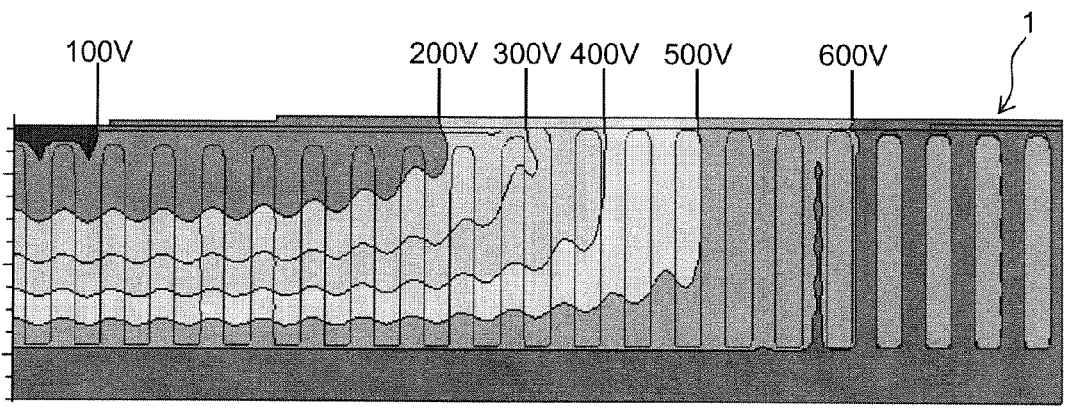

FIGS. 4A and 4B show simulation results for electric potential distribution in the semiconductor device of the comparative example and this embodiment, respectively.

In the following, the simulation method is described.

First, the semiconductor device according to this embodiment is assumed to be the semiconductor device 1 including the n-type RESURF layer shown in FIG. 1. The semiconductor device according to the comparative example is assumed to be the semiconductor device 101 without the n-type RESURF layer shown in FIG. 3. In these semiconductor devices, it is assumed that Qp>Qn. With regard to these semiconductor devices, the potential distribution is determined by simulation in the case where a potential of 600 V is applied to the drain electrode 3 and a potential of 0 V is applied to the source electrode 4. The results are shown in FIGS. 4A and 4B.

As the result of simulation, as shown in FIG. 4A, in the semiconductor device 101 according to the comparative example, the potential in the region corresponding to the RESURF layer was 0 to 100 V. This demonstrates that the potential in the RESURF layer does not sufficiently increase because the electric field, or the gradient of potential, is small in the upper portion of the semiconductor substrate and the RESURF layer is not depleted. Hence the effect of alleviating electric field concentration in the edge termination section is insufficient, and breakdown is likely to occur in the edge termination section. That is, the breakdown voltage of the semiconductor device 101 is determined by the breakdown voltage of the edge termination section.

In contrast, as shown in FIG. 4B, in the semiconductor device 1 according to this embodiment, the potential in the region corresponding to the RESURF layer was 100 to 200 V. This demonstrates that the potential in the RESURF layer increases because the p-type RESURF layer 13 and the n-type RESURF layer 14 are depleted with respect to each other. The increase of potential in the RESURF layer makes the potential distribution uniform, preventing electric field from concentrating on the RESURF edge. In this structure, the breakdown point is located in the cell section, and the breakdown voltage of the semiconductor device 1 is determined by the breakdown voltage of the cell section. Thus, according to this embodiment, high breakdown voltage in the terminal section can be achieved.

Next, a first variation of this embodiment is described.

Figure 5:
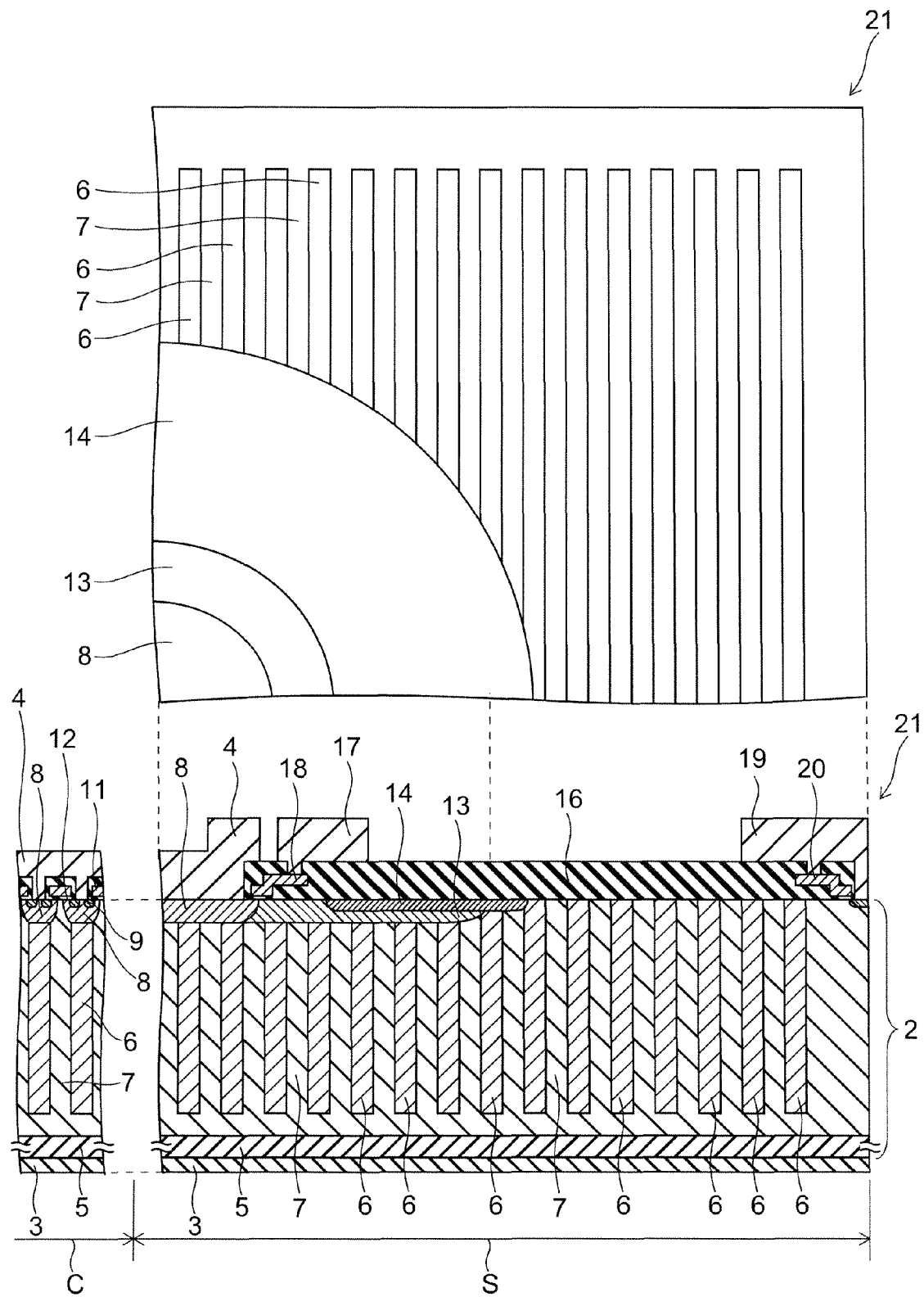
FIG. 5 is a plan view and a cross-sectional view illustrating a semiconductor device according to a first variation of this embodiment.

FIG. 5 shows a plan view and a cross-sectional view illustrating a semiconductor device according to this variation.

As shown in FIG. 5, in the semiconductor device 21 according to this variation, as viewed from above, the n-type RESURF layer 14 is displaced outward with respect to the p-type RESURF layer 13. This allows the outer peripheral portion of the n-type RESURF layer 14 to protrude from the directly overlying region of the p-type RESURF layer 13 and to connect it to the n-type semiconductor pillar layer 7. The configuration, operation, and effect in this variation other than the foregoing are the same as those in the above embodiment.

Next, a second variation of this embodiment is described.

Figure 6:
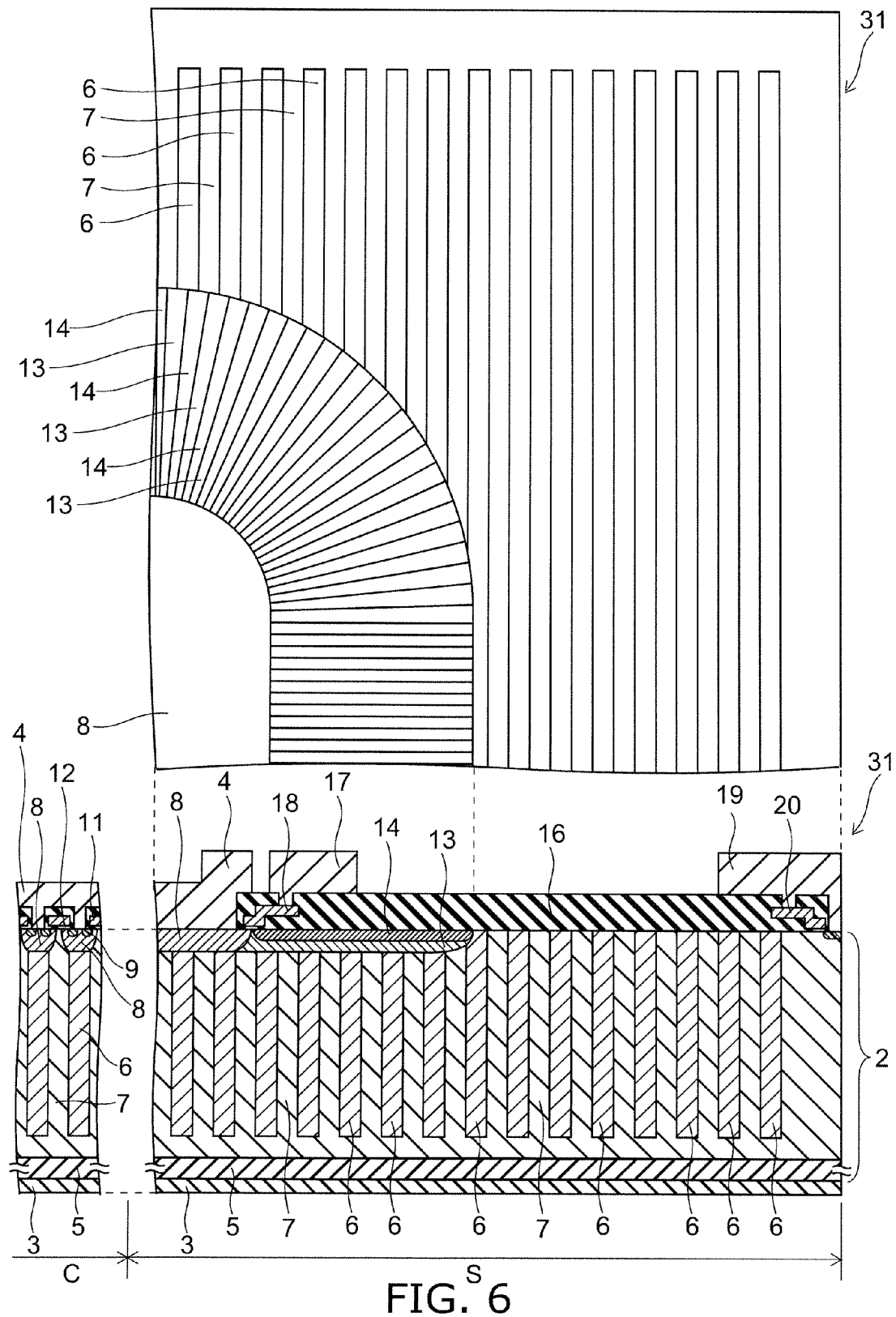
FIG. 6 is a plan view and a cross-sectional view illustrating a semiconductor device according to a second variation of this embodiment.

FIG. 6 shows a plan view and a cross-sectional view illustrating a semiconductor device according to this variation.

As shown in FIG. 6, in the semiconductor device 31 according to this variation, the n-type RESURF layer 14 is divided into a plurality of stripe-shaped portions, which are radially arranged so that each stripe-shaped portion extends from the center toward the outer edge of the semiconductor device 31. That is, as viewed from above, the p-type RESURF layer 13 and the n-type RESURF layer 14 are alternately arranged. Thus the area of the pn junction interface between the p-type RESURF layer 13 and the n-type RESURF layer 14 increases, and the overall RESURF layer can be depleted more easily.

Preferably, the amount of dopant implanted into the p-type RESURF layer 13 is equal to the amount of dopant implanted into the n-type RESURF layer 14. Furthermore, preferably, the dopant concentration in the p-type RESURF layer 13 and the n-type RESURF layer 14 decreases from the center toward the outer edge of the semiconductor device 31. That is, preferably, the dopant concentration in the outer peripheral portion of the RESURF layer is lower than the dopant concentration in the inner peripheral portion. This further facilitates extending the depletion layer to the RESURF edge. It is noted that, also in the above embodiment and the first variation, the dopant concentration in the outer peripheral portion of the RESURF layer may be made lower than the dopant concentration in the inner peripheral portion to facilitate extension of the depletion layer.

The first variation and the second variation described above may be practiced in combination. That is, the n-type RESURF layer 14 may be divided into a plurality of stripe-shaped portions, which may be radially arranged, and the outer tip of each portion may be allowed to protrude from the directly overlying region of the outer edge of the p-type RESURF layer 13. This serves to connect the n-type RESURF layer 14 to the n-type semiconductor pillar layer 7, and to increase the contact area with the p-type RESURF layer 13. Thus the depletion layer can extend more easily.

The invention has been described with reference to the embodiment and its variations. However, the invention is not limited to these embodiment and variations. For example, in the description of the above embodiment, it is assumed that the first conductivity type and the second conductivity type are n-type and p-type, respectively. However, it is also practicable that the first conductivity type and the second conductivity type are p-type and n-type, respectively.

In the above embodiment and variations, the dopant concentration in the p-type semiconductor pillar layer 6 and the n-type semiconductor pillar layer 7 in the edge termination section S may be made lower than their dopant concentration in the cell section C. Thus the breakdown voltage of the edge termination section S can be increased more definitely. Furthermore, the width of the p-type semiconductor pillar layer 6 and the n-type semiconductor pillar layer 7 in the edge termination section S may be made narrower than their width in the cell section C.

The shape of the pillar layers in the MOS gate section and the superjunction structure is not limited to a stripe shape. As viewed from above, the pillar layers of one conductivity type may be arranged in a lattice, dot, mesh, or staggered pattern relative to the pillar layers of the other conductivity type. These configurations can also allow the depletion layer to extend and ensure sufficient breakdown voltage as long as the pn junction interface is formed between the p-type semiconductor pillar layer and the n-type semiconductor pillar layer to compensate for each other.

In the above embodiment and variations, a thick n⁻-type semiconductor layer 40 may be provided between the pillar layers and the n-type semiconductor layer 5 as shown in FIGS. 1, 5, and 6. For example, the dopant concentration in this n⁻-type semiconductor layer is lower than the dopant concentration in the n-type semiconductor layer 5.

In the above embodiment and variations, an electrode 18 is illustratively formed in the insulating film 16 of the edge termination section S. However, formation of the electrode 18 is not essential, but it is only necessary to provide a field plate electrode 17 connected to the gate electrode 11 or the source electrode 4.

In the above embodiment and variations, the RESURF layer illustratively protrudes outside the field plate electrode 17 as viewed from above. However, the invention is not limited thereto. Depending on the breakdown voltage required for the semiconductor device, the width of the RESURF layer may be thinned so that the outer edge of the RESURF layer (RESURF edge) is positioned inside the outer edge of the field plate electrode 17 (on the cell section C side).

In the above embodiment and variations, the semiconductor device is illustratively a MOSFET of the planar gate type. However, the invention is not limited thereto, but the semiconductor device according to the invention may be a MOSFET of the trench gate structure, or a semiconductor device other than MOSFET, such as IGBT.

The invention claimed is:

1. A semiconductor device including a cell section configured to pass main electrical current and a edge termination section surrounding the cell section, the semiconductor device comprising:
   a first semiconductor layer of a first conductivity type;
   a first main electrode connected to the first semiconductor layer;
   a drift layer formed on the first semiconductor layer, the drift layer including a first semiconductor pillar layer of the first conductivity type and a second semiconductor pillar layer of a second conductivity type alternately arranged parallel to an upper surface of the first semiconductor layer;
   a semiconductor base layer of the second conductivity type selectively formed in a surface of the drift layer so as to be connected to the second semiconductor pillar layer;
   a semiconductor source layer of the first conductivity type selectively formed in a surface of the semiconductor base layer;
   a gate insulating film provided above the drift layer;
   a gate electrode insulated from the drift layer and the base layer by the gate insulating film;
   an insulating film provided on the surface of the drift layer in the edge termination section;
   a second main electrode electrically connected to the semiconductor base layer and the semiconductor source layer;
   a first semiconductor RESURF layer of the second conductivity type formed in the surface of the drift layer in the edge termination section and connected to the semiconductor base layer, the first semiconductor RESURF layer being wider in a direction from an inner peripheral portion of the edge termination section toward an outer peripheral portion of the edge termination section than in a direction perpendicular to the upper surface of the first semiconductor layer; and
   a second semiconductor RESURF layer of the first conductivity type disposed between the first semiconductor RESURF layer and the insulating film, and being in contact with the first semiconductor RESURF layer.

2. The semiconductor device according to claim 1, wherein, in an adjacent pair of the first semiconductor RESURF layer and the second semiconductor RESURF layer, dopant dose amount in the first semiconductor RESURF layer is substantially equal to dopant dose amount in the second semiconductor RESURF layer.

3. The semiconductor device according to claim 1, wherein dopant concentration in an outer peripheral portion of the first semiconductor RESURF layer and the second semiconductor RESURF layer is lower than dopant concentration in an inner peripheral portion of the first semiconductor RESURF layer and the second semiconductor RESURF layer.

4. The semiconductor device according to claim 1, wherein the second semiconductor RESURF layer is displaced from the first semiconductor RESURF layer toward outer periphery of the semiconductor device as viewed perpendicular to the upper surface of the first semiconductor layer.

5. The semiconductor device according to claim 1, wherein the second semiconductor RESURF layer is divided into a plurality of stripe-shaped portions, and the stripe-shaped portions are radially arranged so as to extend from center toward outer edge of the semiconductor device as viewed perpendicular to the upper surface of the first semiconductor layer.

6. The semiconductor device according to claim 1, wherein the second semiconductor RESURF layer is divided into a plurality of stripe-shaped portions, the stripe-shaped portions are radially arranged so as to extend from center toward outer edge of the semiconductor device as viewed perpendicular to the upper surface of the first semiconductor layer, and outer ends of the stripe-shaped portions protrude from outer edge of the first semiconductor RESURF layer.

7. The semiconductor device according to claim 1, wherein the first semiconductor RESURF layer is shaped like a ring surrounding the semiconductor base layer as viewed perpendicular to the upper surface of the first semiconductor layer.

8. The semiconductor device according to claim 7, wherein the second semiconductor RESURF layer is shaped like a ring concentric with the first semiconductor RESURF layer as viewed perpendicular to the upper surface of the first semiconductor layer.

9. The semiconductor device according to claim 8, wherein outer edge of the second semiconductor RESURF layer is placed at the same position as outer edge of the first semiconductor RESURF layer as viewed perpendicular to the upper surface of the first semiconductor layer.

10. The semiconductor device according to claim 8, wherein outer edge of the second semiconductor RESURF layer is placed outside outer edge of the first semiconductor RESURF layer as viewed perpendicular to the upper surface of the first semiconductor layer.

11. The semiconductor device according to claim 1, wherein dopant concentration in the first semiconductor RESURF layer is lower than dopant concentration in the semiconductor base layer.

12. The semiconductor device according to claim 1, wherein dose amount which is a integral of a dopant concentration profile along a depth direction in the first semiconductor RESURF layer and dose amount which is a integral of a dopant concentration profile along a depth direction in the second semiconductor RESURF layer are $1 \times 10^{11}$ to $3 \times 10^{12}$ $cm^{-2}$, respectively.

13. The semiconductor device according to claim 1, wherein dopant concentrations in the first semiconductor pillar layer and the second semiconductor pillar layer in the edge termination section are lower than dopant concentrations in the first semiconductor pillar layer and the second semiconductor pillar layer in the cell section.

14. The semiconductor device according to claim 1, further comprising a low concentration layer of the first conductivity type provided between the first semiconductor layer and the drift layer, the low concentration layer having dopant concentration lower than dopant concentration in the first semiconductor layer.

15. A semiconductor device comprising:
a drift layer having a superjunction structure;
a semiconductor base layer selectively formed in a part of one surface of the drift layer;
a first semiconductor RESURF layer formed around a region having the semiconductor base layer formed thereon and formed on a part of the superjunction structure, the first semiconductor RESURF layer being connected to the semiconductor base layer and having a same conductivity type as the semiconductor base layer;
an insulating film provided above the first semiconductor RESURF layer;
a second semiconductor RESURF layer of a conductivity type which is opposite to a conductivity type of the first semiconductor RESURF layer, the second semiconductor RESURF layer disposed between the first semiconductor RESURF layer and the insulating film, and being in contact with the first semiconductor RESURF layer;
a first main electrode connected to a first surface of the drift layer; and
a second main electrode connected to a second surface of the drift layer.

16. The semiconductor device according to claim 15, wherein the second semiconductor RESURF layer is closer to a surface of the drift layer than the first semiconductor RESURF layer.

17. The semiconductor device according to claim 15, wherein the first semiconductor RESURF layer is shaped like a ring as viewed perpendicular to a surface of the drift layer.

18. The semiconductor device according to claim 15, wherein the second semiconductor RESURF layer is shaped like a ring as viewed perpendicular to a surface of the drift layer.

19. The semiconductor device according to claim 15, wherein outer edge of the second semiconductor RESURF layer is placed outside outer edge of the first semiconductor RESURF layer as viewed perpendicular to a surface of the drift layer.

20. The semiconductor device according to claim 15, wherein the second semiconductor RESURF layer is divided into a plurality of stripe-shaped portions, and the stripe-shaped portions are radially arranged so as to extend from center toward outer edge of the semiconductor device as viewed perpendicular to a surface of the drift layer.

* * * * *